US006706598B2

United States Patent
Lai

(10) Patent No.: US 6,706,598 B2
(45) Date of Patent: Mar. 16, 2004

(54) METHOD OF FABRICATING DISCRETE NROM CELL BY SELF ALIGNED PROCESS

(75) Inventor: Erh-Kun Lai, Taichung (TW)

(73) Assignee: Macronix International Co., Ltd., HsinChu (TW)

(*) Notice: Subject to any disclaimer, the term of this patent is extended or adjusted under 35 U.S.C. 154(b) by 0 days.

(21) Appl. No.: 10/183,851

(22) Filed: Jun. 28, 2002

(65) Prior Publication Data

US 2004/0002182 A1 Jan. 1, 2004

(51) Int. Cl.[7] ............................................. H01L 21/336
(52) U.S. Cl. ........................................ 438/261; 438/954
(58) Field of Search ........................ 438/261, 275–278, 438/288, 299, 954

(56) References Cited

U.S. PATENT DOCUMENTS 6,436,778 B1 * 8/2002 Fang et al. .................. 438/305

* cited by examiner

Primary Examiner—Kamand Cuneo
Assistant Examiner—Asok Kumar Sarkar
(74) Attorney, Agent, or Firm—Rabin & Berdo, P.C.

(57) ABSTRACT

A method of fabricating a discrete NROM cell by a self-aligned process includes providing a substrate with an ONO layer, wherein the ONO layer includes a top oxide layer, a nitride layer and a bottom oxide layer. The top oxide layer is etched to form a discrete top oxide layer. Disposable spacers are formed at the sidewalls of the discrete top oxide layer. A bit line and pocket implant are implanted by a self-aligned process. The discrete top oxide layer is removed, and the nitride layer is etched according to the disposable spacers. The disposable spacers are removed to form discrete nitrides. The bottom oxide layer is etched according to the discrete nitride layer to form discrete pillars, so that a channel is formed between two discrete pillars. Channel oxides are formed in the channels. An oxide layer is formed over the discrete channel oxides and the discrete nitrides.

8 Claims, 8 Drawing Sheets

METHOD OF FABRICATING DISCRETE NROM CELL BY SELF ALIGNED PROCESS

BACKGROUND OF THE INVENTION

1. Field of the Invention

The invention relates in general to a method of fabricating nitride read-only memory (NROM) cells, and more particularly to the method of fabricating discrete NROM cell by self-aligned process.

2. Description of the Related Art

The memory devices for non-volatile storage of information, such as read only memory (ROM), programmable read only memory (PROM), erasable programmable read only memory (EPROM), and other advanced memory devices, are currently used in the worldwide industries. The other advanced memory devices that involve more complex processing and testing procedures include electrically erasable programmable read only memory (EEPROM), flash EEPROM, and nitride read-only memory (NROM). These advanced memory devices can accomplish the tasks that ROM can't do. For example, using EEPROM devices in circuitry permits in-circuit erasing and reprogramming of the device.

The main characteristic of NROM is dual bit cells having multiple threshold voltage levels, where every two threshold voltage levels together store a different bit. Others store one bit on either side of the cell. The conventional structures and fabricating methods of NROM cell are described in a lot of articles and references. For example, a dual bit cell of NROM cell is disclosed in U.S. Pat. No. 6,215,148, entitled "NROM cell with improved programming, erasing and cycling". The process of NROM cell is disclosed in U.S. Pat. No. 6,201,282, entitled "Two bit ROM cell and process for producing same". The disclosure of the above-identified patent is incorporated herein by reference.

FIG. 1 is a cross-sectional view of conventional NROM cells. The substrate 10 is implanted with a source 12 and a drain 14. The top of the substrate 10 includes a sandwiched structure having a nitride layer 17 between a top oxide layer 16 and a bottom oxide layer (tunneling oxide layer) 18, the so-called "ONO" structure. A number of BD (buried diffusion) oxide portions 20 are formed to isolate the adjacent ONO structure and form the channels 22. The structure of an NROM cell, which contains dual bits in one cell, is also depicted in FIG. 1. The larger region (encircled with the dashed line) denotes an NROM cell 30, and the two smaller regions encircled with the dashed line denote the first bit 32 and the second bit 34.

In the NROM cell, the nitride layer 17 provides the charge retention mechanism for programming the memory cell. Under normal condition, the electrons are introduced into the nitride layer 17 during a reading of the cell, while the holes are introduced into the nitride layer 17 to replace the electrons during an un-reading of the cell. Simply stated, the electrons should be able to move between the nitride layer 17 and the implant. However, nitride tends to trap electrons that are introduced in the nitride layer 17 due to its structure. If the electrons are trapped and un-removable, the cell programming function fades out or the whole cell is even ruined.

Additionally, according to the hot electron injection phenomenon, some hot electrons will penetrate through the bottom oxide layer 18, especially when it is thin, and then collected in the nitride layer 17. Concentrated charge caused by the hot electrons significantly raises the threshold of the portion of the channel 22 under charge to be higher than the threshold of the remaining portion of the channel 22. When the cell is programmed, the concentrated charge is presented and the raised threshold does not permit the cell to reach the conductive state. In a normal state, which the concentrated charge is not presented, the reading voltage over the channel can overcome the threshold of the channel 22 and consequently the channel 22 is conductive.

Moreover, the conventional NROM cell is fabricated by using several steps of photolithography. The implant and the bits are not easily formed at the right position could be shifted, so that the efficiency of the NROM cell is decreased.

SUMMARY OF THE INVENTION

It is therefore an object of the invention to provide a method of fabricating discrete NROM cell by self-aligned process, so that the problem of electrons trapped in the nitride layer of the NROM cell can be solved, and also the mutual positions of the implant and ONO structure can be exactly controlled.

The invention achieves the above-identified objects by providing a method of fabricating a discrete NROM cell by a self aligned process, comprising the steps of providing a substrate with already formed an ONO layer, wherein the ONO layer includes a top oxide layer, a nitride layer and a bottom oxide layer; etching the top oxide layer to form a discrete top oxide layer; forming a plurality of disposable spacers at the sidewalls of the discrete top oxide layer; implanting buried bit line and pocket implant by the self-aligned process; removing the discrete top oxide layer and etching the nitride layer according to the disposable spacers; removing the disposable spacers to form a plurality of discrete nitrides; etching the bottom oxide layer according to the discrete nitride layer to form a plurality of discrete pillars, so that a channel is formed between two discrete pillars; forming a plurality of channel oxides in the channels; and forming an oxide layer over the discrete channel oxides and the discrete nitrides.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DETAILED DESCRIPTION OF THE INVENTION

Figure 1:
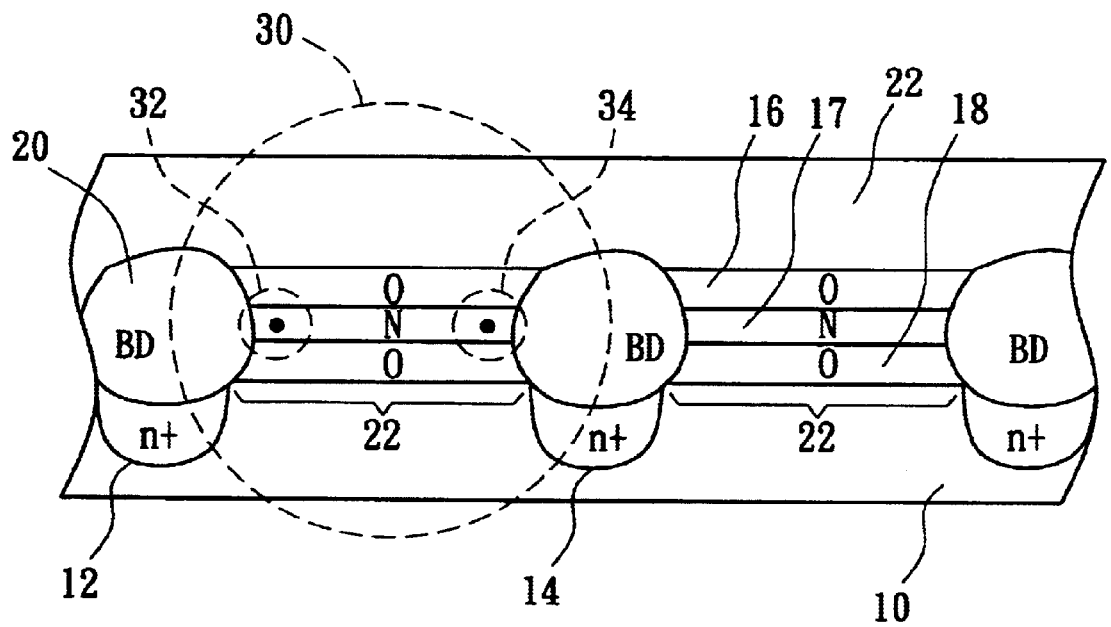
FIG. 1 (prior art) is a cross-sectional view of a conventional NROM cells.

Although two methods are taken for examples to illustrate how to fabricate the discrete NROM cell by self-aligned process, the invention is not limited to the disclosed embodiments. Also, to avoid obscuring the invention, well-known elements not directly relevant to the invention are not shown or described. Accordingly, the specification and the drawing are to be regard as an illustrative sense rather than a restrictive sense.

EXAMPLE 1

Figure 2A:
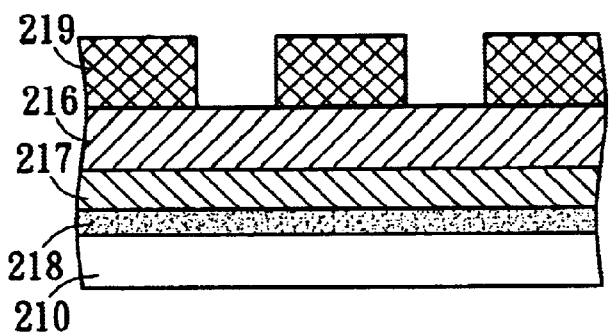
FIG. 2A–FIG. 2M illustrate the method of fabricating a discrete NROM cell by self-aligned process according to the first embodiment of the invention.

FIG. 2A–FIG. 2M illustrate the method of fabricating a discrete NROM cell by self-aligned process according to the first embodiment of the invention. In FIG. 2A, a substrate 210 is provided and a sandwiched structure known as an ONO layer is formed thereon. The ONO layer includes a bottom oxide layer (tunneling oxide layer) 218 grown on the substrate 210, a nitride layer 217 deposited over the bottom oxide layer 218, and a top oxide layer 216 produced on the nitride layer 217. Then, photo-resist (PR) is deposited over the top oxide layer 216 and patterned according to the mask (not shown in FIG. 2A) to form a patterned PR 219.

The thickness of the bottom oxide layer 218 typically ranges from 50 Å to 150 Å, and preferably about 70 Å. The thickness of the nitride layer 217 typically ranges from 20 Å to 150 Å. The thickness of the top oxide layer 216 is not limited since it will be removed in the following procedures. However, it will be appreciated that the thicknesses of ONO layer are generally independent of each other, and variable depending on the field of NROM cell application.

Figure 2B:
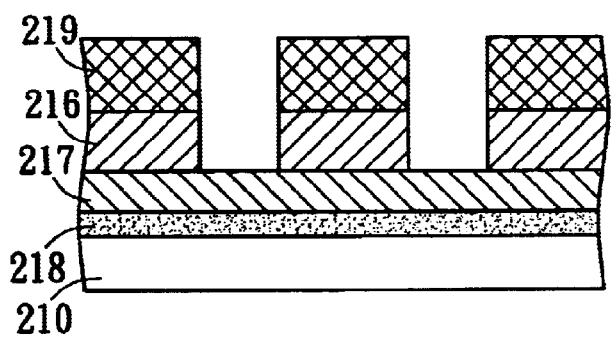
Figure 2C:
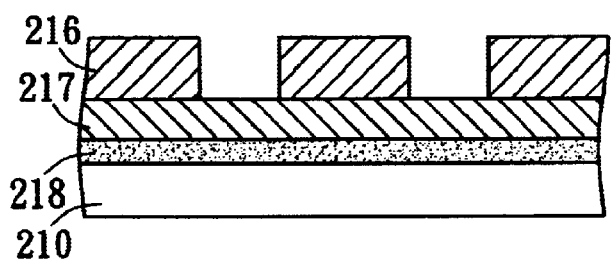

Next, the top oxide layer 216 is etched according to the patterned PR 219, as shown in FIG. 2B. The top oxide under the patterned PR 219 remains on while the others not be covered are etched away. Then, the patterned PR 219 is removed and a discrete top oxide layer is formed, as shown in FIG. 2C.

Figure 2D:
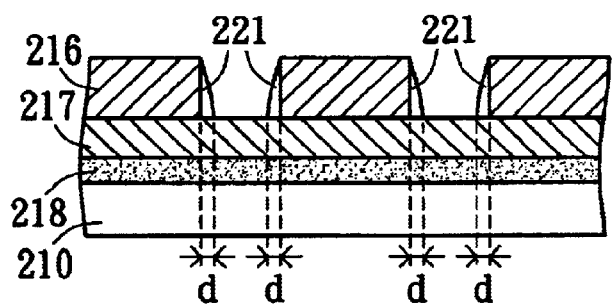

A disposable film is then formed over the discrete top oxide layer 216 and portion of the nitride layer 217 by conformal deposition. Subsequently, the disposable film is etched by a non-conformal etching process, and the disposable spacers 221 are formed on the sides of the discrete top oxide, as shown in FIG. 2D. The disposable film could be any material that can be differentiated from nitride. For example, using polysilicon as the disposable film, it can be selectively etched away and makes the etching process easy to be controlled. Also, it is noted that the bottom width of the disposable spacer 221 is controlled at a predetermined value (d).

Figure 2E:
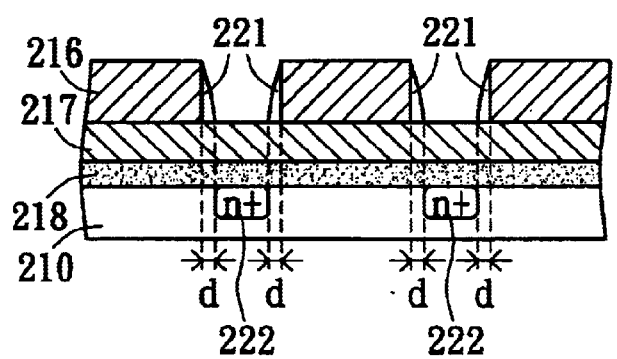
Figure 2F:
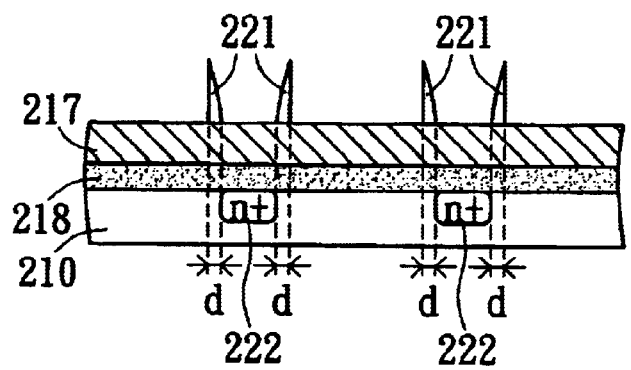

As illustrated by FIG. 2E, the buried bit line and pocket implant 222 are implanted by a self-aligned process. The buried bit line is phosphorus (P) or arsenic (As), and the pocket implant is boron (B) or $BF_2^+$. Then, the top oxide layer 216 is etched away by the high selectivity of the disposable film (poly) and oxide, as shown in FIG. 2F.

Figure 2G:
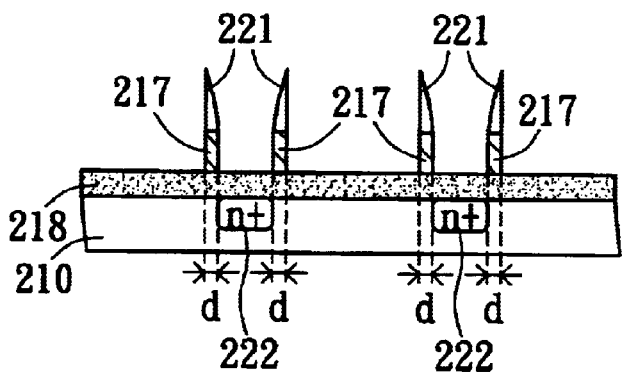
Figure 2H:
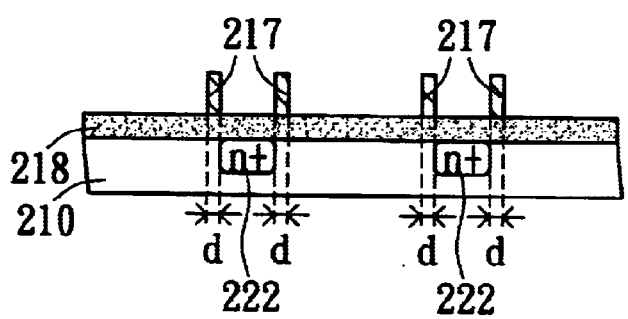
Figure 2I:
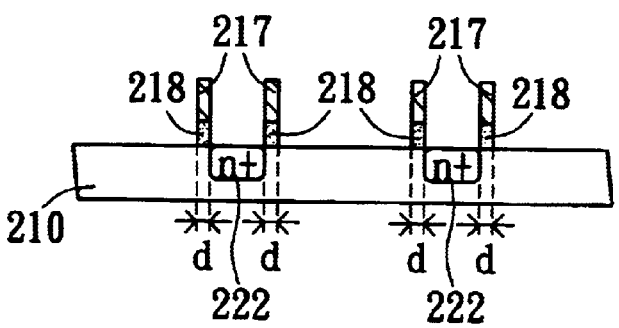

In FIG. 2G, the nitride layer 217 is etched by the high selectivity of disposable film (poly), nitride and oxide. The nitride sheltered by the disposable spacers 221 remains on the bottom oxide while the other portions not covered by the spacers are etched away. Then, the disposable spacers 221 are removed, as shown in FIG. 2H. After that, the bottom oxide 218 is etched according to remaining nitride 217, as shown in FIG. 2I.

Figure 2J:
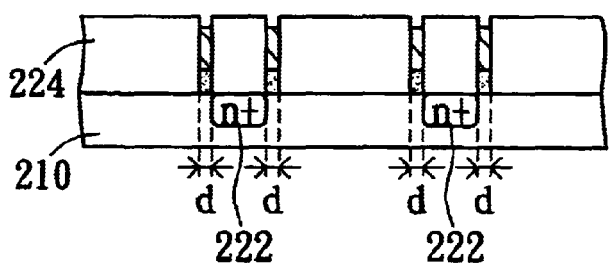
Figure 2K:
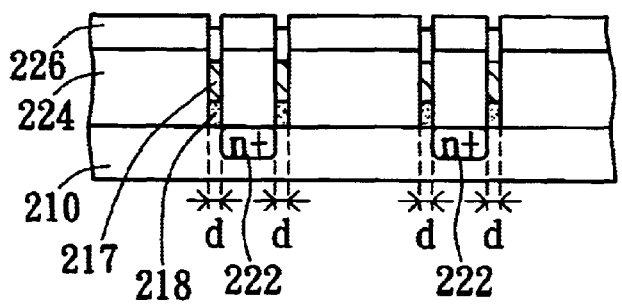

As far as the process describes, the nitride layer 217 and the bottom oxide layer 218 have been etched and formed as a plurality of pillars. Between the discrete pillars is a channel. In FIG. 2J, those channels are filled with the oxide 224 by oxidation or by deposition. Then, another oxide layer 226 is formed over the channel oxide 224 and the nitride layer 217, as shown in FIG. 2K. The oxide layer 226 is produced either through oxidation of the nitride, or by deposition, or by a combination thereof.

Figure 2L:
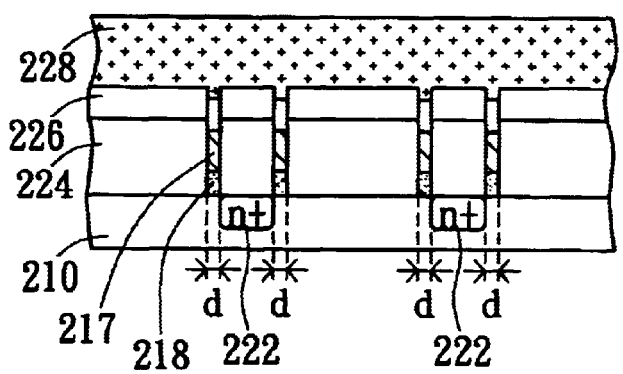

Following the channel oxidation step, a layer such as a polysilicon layer 228 is formed over the oxide layer 226 as a cap in FIG. 2L. The polysilicon layer can be amorphous polysilicon, or grand polysilicon, or dopant polysilicon. Also, in the particular process, the tungsten suicide ($WSi_x$) is subsequently deposited over the polysilicon layer 228 (not shown in FIG. 2L). The polysilicon layer 228 is formed as the electrode, and can be patterned as the word-line.

Figure 2M:
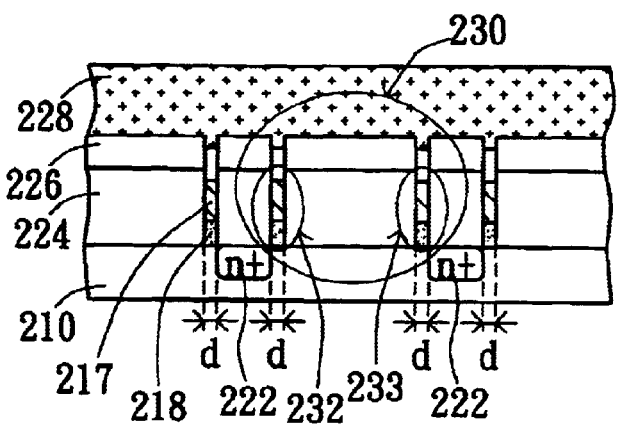

The NROM cell is then finished in the aforementioned ways, and the discrete NROM cell of the invention is depicted in FIG. 2M. The larger encircled region denotes a NROM cell 230, and the two smaller encircled regions denote the first bit 232 and the second bit 233. Two bits are in the predetermined width (d). It is noted that the buried bit line and pocket implant are implanted by self-aligned process and the following steps are also performed by self-aligned process. Therefore, the mutual position of the buried bit line and pocket implant 222 and the ONO layer can be easily and exactly controlled.

EXAMPLE 2

Figure 3A:
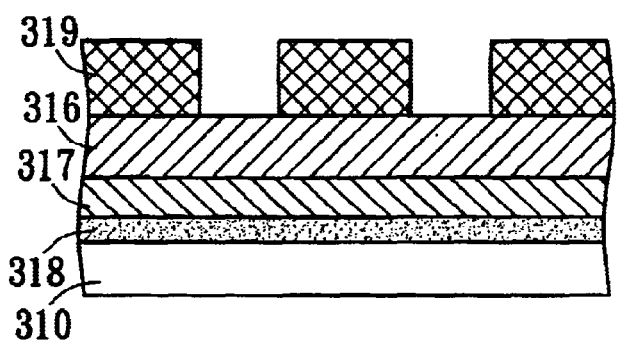
FIG. 3A–FIG. 3P illustrate the method of fabricating the discrete NROM cell by self-aligned process according to the second embodiment of the invention.
Figure 3B:
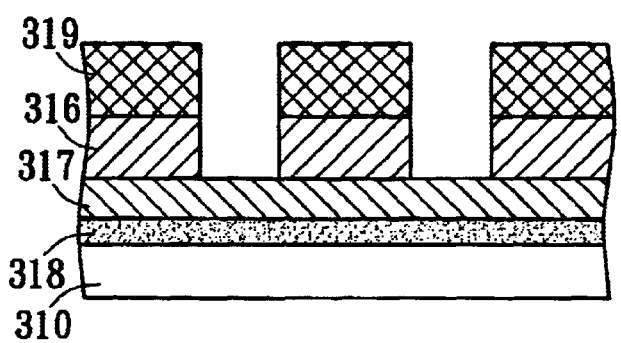
Figure 3C:
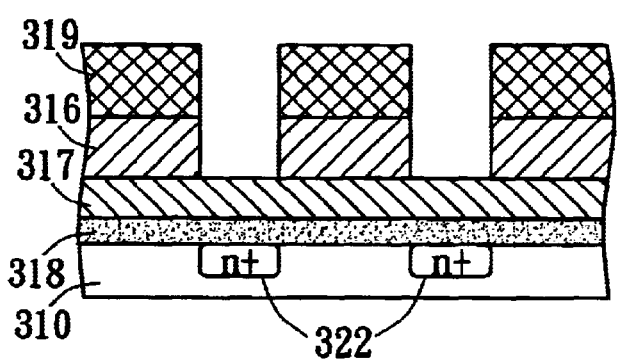
Figure 3D:
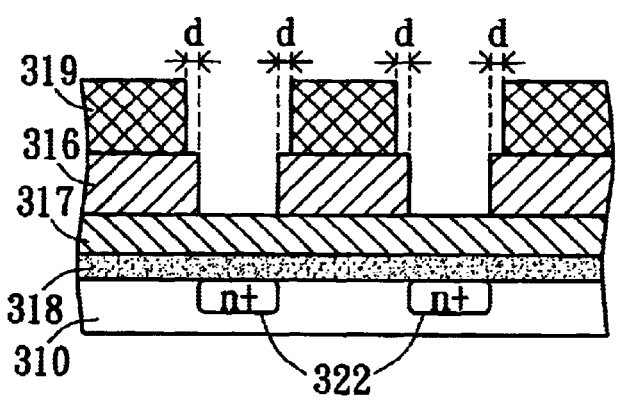
Figure 3E:
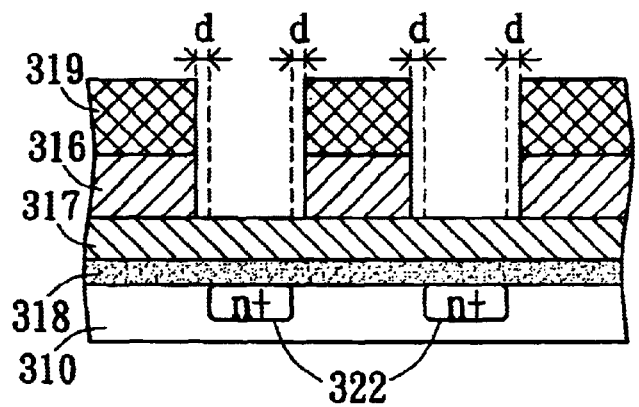
Figure 3F:
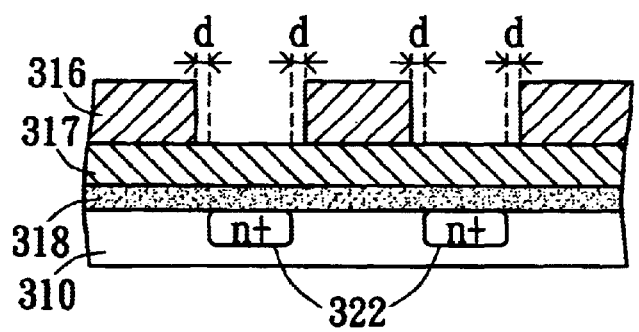
Figure 3G:
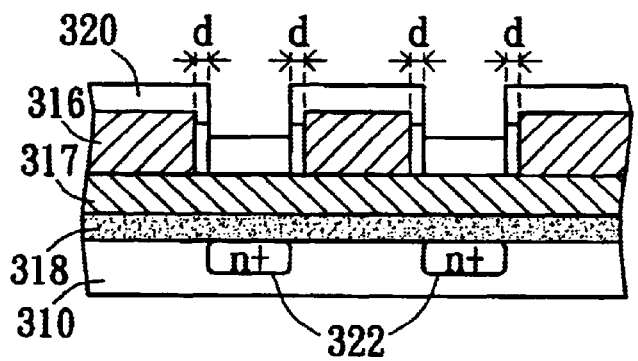
Figure 3H:
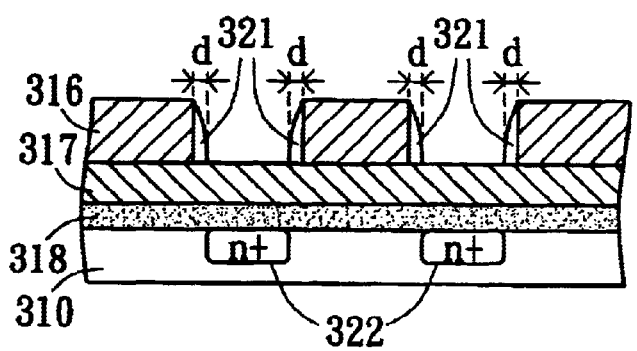
Figure 3I:
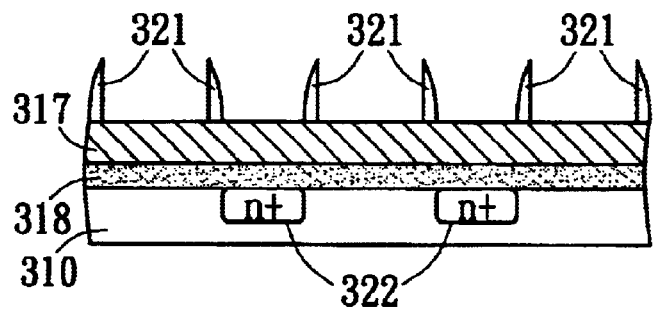
Figure 3J:
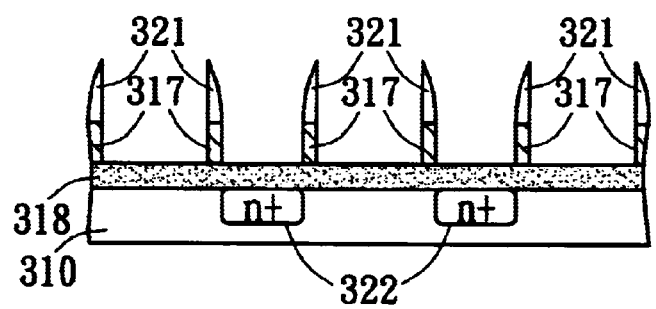
Figure 3K:
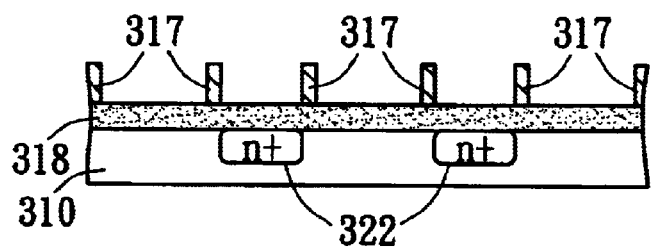
Figure 3L:
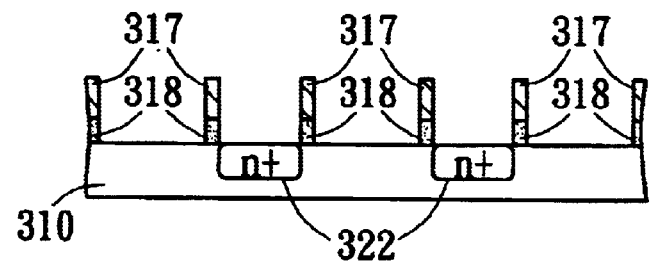
Figure 3M:
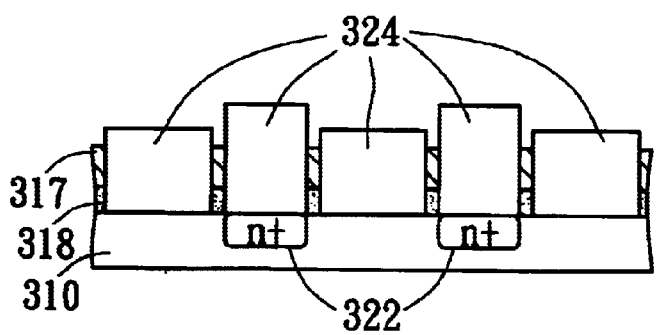
Figure 3N:
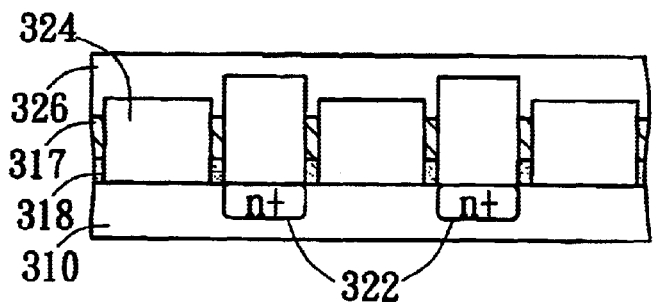
Figure 3O:
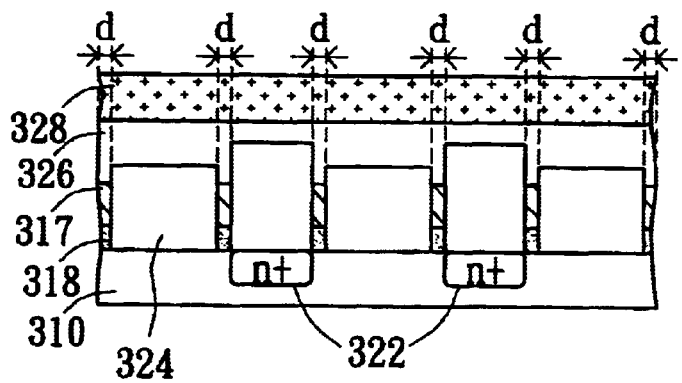
Figure 3P:
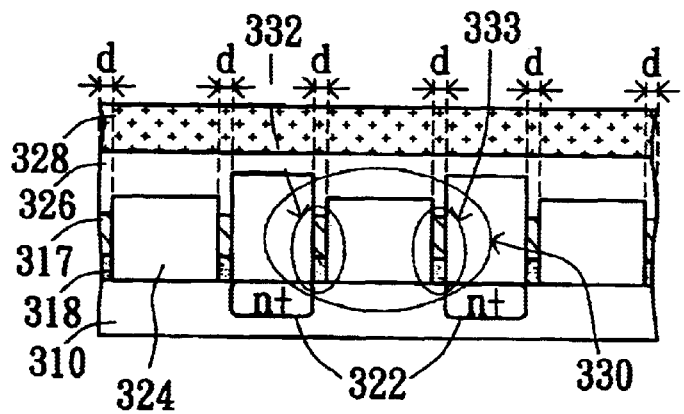

FIG. 3A–FIG. 3P illustrate the method of fabricating a discrete NROM cell by a self-aligned process according to the second embodiment of the invention. The fabricating method of Example 2 is mostly the same as that of Example 1, but some steps are slightly modified or changed to be in different orders.

The drawings of FIG. 3A and FIG. 3B are identical with FIG. 2A and FIG. 2B. In FIG. 3A, a substrate 310 is first provided and a ONO structure including a top oxide layer 316, a nitride layer 317, and a bottom oxide layer (tunneling oxide layer) 318 is formed thereon. Then, a patterned photo-resist (PR) 319 is formed over the top oxide layer 316 by photolithography. Similarly, the thicknesses of three layers of ONO structure are generally independent of each other, and variable depending on the field of NROM cell application. Next, the top oxide layer 316 is etched according to the patterned PR 319, as shown in FIG. 3B.

After that, the buried bit line and pocket implant 322 are implanted by a self-aligned process, as shown in FIG. 3C. The buried bit line is phosphorus (P) or arsenic (As), and the pocket implant is boron (B) or $BF_2^+$. Then, the patterned PR 319 is descummed for exposing the portion of the top oxide layer 316 at the predetermined width d, as illustrated in FIG. 3D.

The top oxide layer 316 is then etched according to the PR descum, and followed by removing PR 319, as shown in FIG. 3E and FIG. 3F.

As illustrated in FIG. 3G, a disposable film 320 is then formed over the discrete top oxide layer 316 and the portion of the nitride layer 317 by conformal deposition. Subsequently, the disposable film 320 is etched by a non-conformal etching process, and the disposable spacers 321 are formed on the sides of the discrete top oxide layer 316, as shown in FIG. 3H. The disposable film could be any material that can be differentiated from nitride, such as polysilicon. Also, it is noted that the bottom width of the disposable spacer 321 is controlled at the predetermined value, d.

Next, the discrete top oxide layer 316 is etched away by the high selectivity of disposable film (poly), nitride and oxide, as shown in FIG. 3I. The nitride layer 317 is then etched according to the disposable spacer 321. The nitride sheltered by the disposable spacers 321 remains on the bottom oxide layer 318 while the other portion not covered by is etched away, as shown in FIG. 3J.

In FIG. 3K, the disposable spacers 321 are removed. The bottom oxide 318 is then etched according to the remaining nitride, as shown in FIG. 3L. As far as the foregoing steps describe, the nitride layer 317 and the bottom oxide layer 318 have been etched and formed as a plurality of pillars (FIG. 3L). Between the discrete pillars is a channel. In FIG. 3M, those channels are filled with the oxide 324 by oxidation or deposition. Then, another oxide layer 326 is formed over the channel oxide 324 and the nitride layer 317, as shown in FIG. 3N. The oxide layer 326 is produced either through oxidation of the nitride, or by deposition, or by a combination thereof.

Following the oxidation, the oxide layer 326 is capped with a film such as a polysilicon layer 328, as shown in FIG. 3O. The polysilicon layer 328 is formed as the electrode, and can be patterned as the word-line.

The NROM cell is then finished in the aforementioned ways, and the discrete NROM cell of the invention is depicted in FIG. 3P. The larger encircled region denotes a NROM cell 330, and the two smaller encircled regions denote the first bit 332 and the second bit 333. Two bits are in the predetermined width of d. It is noted that the buried bit line and pocket implant are implanted by a self-aligned process and the following steps are also performed by self-aligned process. Therefore, the mutual position of the buried bit line and pocket implant 322 and the ONO layer can be easily and exactly controlled.

The present invention uses the self-aligned process to fabricate the NROM memory cell, and the buried bit line implant, pocket implant and dual bit in one cell are exactly formed at the right positions. Also, the bits of the invention are separated by channel oxide so that the problem due to the electrons being trapped in the nitride layer can be solved.

While the invention has been described by ways of examples and in terms of the preferred embodiments, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a discrete NROM cell by a self aligned process, comprising the steps of:

providing a substrate with an ONO layer, wherein the ONO layer includes a top oxide layer, a nitride layer, and a bottom oxide layer;

etching the top oxide layer to form a discrete top oxide layer;

forming a plurality of disposable spacers at the sidewalls of the discrete top oxide layer;

implanting a bit line and pocket implant by a self-aligned process;

removing the discrete top oxide layer, and etching the nitride layer according to the disposable spacers;

removing the disposable spacers to form a plurality of discrete nitrides;

etching the bottom oxide layer according to the discrete nitrides to form a plurality of discrete pillars, so that a channel is formed between two discrete pillars;

forming a plurality of channel oxides in the channels; and forming an oxide layer over the discrete channel oxides and the discrete nitrides.

2. The method of fabricating a discrete NROM cell according to claim 1, wherein the step of forming the discrete top oxide layer further comprises the steps of:

placing a photoresist on the top oxide layer;

placing a mask on the photoresist;

etching the top oxide layer; and removing the photoresist.

3. The method of fabricating a discrete NROM cell according to claim 1, wherein the step of forming a disposable spacer further comprises the steps of:

forming a disposable film on the top oxide layer by conformal deposition; and etching the disposable film by a non-conformal etching process.

4. The method of fabricating a discrete NROM cell according to claim 3, wherein the disposable film is polysilicon.

5. The method of fabricating a discrete NROM cell according to claim 1, wherein the oxide layer, formed over the discrete channel oxides and the discrete nitrides, is produced either through oxidation of the nitrides or by deposition or by a combination thereof.

6. The method of fabricating a discrete NROM cell according to claim 1, wherein after the step of forming the oxide layer over the discrete channel oxides and the discrete nitrides, the oxide layer is capped with an electrode layer.

7. The method of fabricating a discrete NROM cell according to claim 6, wherein the electrode layer is polysilicon.

8. The method of fabricating a discrete NROM cell according to claim 1, wherein the step of forming the discrete top oxide layer further comprises the steps of;

forming a patterned photoresist;

descumming the patterned photoresist;

etching the top oxide layer according to the descummed patterned photoresist; and removing the photoresist.

* * * * *